(12) United States Patent
Lu

(10) Patent No.: US 9,799,722 B1
(45) Date of Patent: Oct. 24, 2017

(54) INDUCTIVE COMPONENT AND PACKAGE STRUCTURE THEREOF

(71) Applicant: CYNTEC CO., LTD., Hsinchu (TW)

(72) Inventor: Bau-Ru Lu, Changhua County (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 15/285,485

(22) Filed: Oct. 5, 2016

(51) Int. Cl.
| | | |
|---|---|---|
| H01L 23/00 | (2006.01) |
| H01L 49/02 | (2006.01) |
| H01F 27/28 | (2006.01) |
| H01F 27/29 | (2006.01) |
| H01F 27/24 | (2006.01) |
| H01L 23/522 | (2006.01) |
| H01L 23/552 | (2006.01) |
| H01L 25/065 | (2006.01) |

(52) U.S. Cl.
CPC ............. *H01L 28/10* (2013.01); *H01F 27/24* (2013.01); *H01F 27/2804* (2013.01); *H01F 27/29* (2013.01); *H01L 23/5227* (2013.01); *H01L 23/552* (2013.01); *H01L 25/0652* (2013.01); *H01L 25/0657* (2013.01); *H01F 2027/2809* (2013.01)

(58) Field of Classification Search
CPC .... H01L 23/5227; H01L 23/645; H01L 28/10
See application file for complete search history.

(56) References Cited

U.S. PATENT DOCUMENTS

| | | | | |
|---|---|---|---|---|
| 5,959,846 | A * | 9/1999 | Noguchi | H01F 17/0033 257/690 |
| 7,671,716 | B2 * | 3/2010 | Chen | H01F 17/0033 336/200 |
| 2013/0005109 | A1 * | 1/2013 | Dao | H01L 28/10 438/381 |
| 2014/0312458 | A1 * | 10/2014 | Ashrafzadeh | H01L 23/3121 257/531 |
| 2015/0123251 | A1 * | 5/2015 | Chiu | H01L 23/552 257/659 |
| 2016/0233292 | A1 * | 8/2016 | Chen | H01L 28/10 |

* cited by examiner

*Primary Examiner* — Benjamin Sandvik
(74) *Attorney, Agent, or Firm* — Min-Lee Teng; Litron Patent & Trademark Office

(57) ABSTRACT

An inductive component and package structure is provided, comprising a magnetic body having a top surface and a bottom surface, wherein a plurality of conductive through holes are formed from the top surface to the bottom surface of the magnetic body, and the plurality of conductive through holes are electrically connected via first conductive patterns disposed over the top surface of the magnetic body and second conductive patterns disposed over the bottom surface of the magnetic body so as to form at least one conductive path, each passing through a corresponding set of conductive through holes, wherein each of the at least one conductive path has two terminals and a corresponding inductance. At least one portion of a first electronic device is disposed in a first space, at least partially surrounded by the at least one conductive path.

20 Claims, 9 Drawing Sheets

INDUCTIVE COMPONENT AND PACKAGE STRUCTURE THEREOF

BACKGROUND OF THE INVENTION

Field of the Invention

The invention relates to inductive components and, in particular, the integration of an inductor with an electronic device.

Description of the Related Art

Most integrated circuits (ICs) are assembled by placing ICs on a lead frame, bonding the ICs to metal leads of the lead frame, and then encapsulating the ICs in a protective body, wherein molding, plating and trimming and forming are performed. Thereafter, the ICs are tested.

While cost effective and efficient, and despite advances in IC fabrication, driven by design, costs, smaller size or other considerations, some functional requirements of systems are often not designed into the ICs, for example, those of inductors and capacitors. Particularly for inductive components, due to their design, a magnetic field may induce current in other parts or circuitry of ICs; thus, affecting the performance of the ICs. Accordingly, when inductive components are required in systems along with the ICs, they are often electrically connected externally. Thus, the total layout area when designing a system having an IC and inductive component is relatively large; especially when considering the trend towards miniaturization. Also, the advantages of modulation may not be achieved as the IC and inductive component are manufactured, packaged and tested, individually.

Accordingly, there is demand for inductive components and package structures thereof to solve the aforementioned problems.

BRIEF SUMMARY OF THE INVENTION

A detailed description is given in the following embodiments with reference to the accompanying drawings.

In an embodiment, an inductive component is provided. The inductive component comprises a magnetic body having a top surface and a bottom surface, wherein a plurality of conductive through holes are formed from the top surface to the bottom surface of the magnetic body, and the plurality of conductive through holes are electrically connected via first conductive patterns disposed over the top surface of the magnetic body and second conductive patterns disposed over the bottom surface of the magnetic body so as to form at least one conductive path, each passing through a corresponding set of conductive through holes, wherein each of the at least one conductive path has two terminals and a corresponding inductance. In the embodiment, the first conductive patterns comprise a plurality of first traces and the second conductive patterns comprise a plurality of second traces to electrically connect each two corresponding conductive through holes on the top and bottom surfaces, respectively, of the magnetic body. In the embodiment, the at least one conductive path forms a coil having a first terminal and a second terminal. In another embodiment, the at least one conductive path forms more than one inductive path having more than two terminals and corresponding inductances. In the embodiment, at least one portion of a first electronic device is disposed in a first space, at least partially surrounded by the at least one conductive path.

In an embodiment, an inductive component is provided. The inductive component comprises a magnetic body having a top surface and a bottom surface, wherein a plurality of conductive through holes are formed from the top surface to the bottom surface of the magnetic body, and the plurality of conductive through holes are electrically connected via first conductive patterns disposed over the top surface of the magnetic body and second conductive patterns disposed over the bottom surface of the magnetic body so as to form at least one conductive path, each passing through a corresponding set of conductive through holes, wherein each of the at least one conductive path has two terminals and a corresponding inductance. In the embodiment, the first conductive patterns comprise a plurality of first traces and the second conductive patterns comprise a plurality of second traces to electrically connect each two corresponding conductive through holes on the top and bottom surfaces, respectively, of the magnetic body. Additionally, first and second shielding layers are disposed over the first and second conductive patterns, respectfully. In the embodiment, the at least one conductive path forms a coil having a first terminal and a second terminal. In another embodiment, the at least one conductive path forms more than one inductive path having more than two terminals and corresponding inductances. In the embodiment, at least one portion of a first electronic device is disposed in a first space, at least partially surrounded by the at least one conductive path.

In yet another embodiment, an inductive component is provided. The inductive component comprises a magnetic body having a top surface and a bottom surface, wherein a plurality of conductive through holes are formed from the top surface to the bottom surface of the magnetic body, and the plurality of conductive through holes are electrically connected via first conductive patterns disposed on a first insulating layer disposed over the top surface of the magnetic body and second conductive patterns disposed on a second insulating layer disposed over the bottom surface of the magnetic body so as to form at least one conductive path, each passing through a corresponding set of conductive through holes, wherein each of the at least one conductive path has two terminals and a corresponding inductance. In the embodiment, the first conductive patterns comprise a plurality of first bonding wires and the second conductive patterns comprise a plurality of second bonding wires to electrically connect each two corresponding conductive through holes on the top and bottom surfaces, respectively, of the magnetic body. In the embodiment, the at least one conductive path forms a coil having a first terminal and a second terminal. In another embodiment, the at least one conductive path forms more than one inductive path having more than two terminals and corresponding inductances. In the embodiment, at least one portion of a first electronic device and at least one portion of a second electronic device are disposed in first and second spaces, respectfully, at least partially surrounded by the at least one conductive path.

In an embodiment, a package structure is provided. The package structure comprises a magnetic body having a top surface and a bottom surface, wherein a plurality of conductive through holes are formed from the top surface to the bottom surface of the magnetic body, and the plurality of conductive through holes are electrically connected via first conductive patterns disposed over the top surface of the magnetic body and second conductive patterns disposed over the bottom surface of the magnetic body so as to form at least one conductive path, each passing through the plurality of conductive through holes, wherein each of the at least one conductive path has two terminals and a corresponding inductance. In the embodiment, the first conductive patterns comprise a plurality of first traces and the second conductive patterns comprise a plurality of second traces to electrically connect each two corresponding conductive through holes on the top and bottom surfaces, respectively, of the magnetic body. In the embodiment, the at least one conductive path forms a coil having a first terminal and a second terminal. In another embodiment, the at least one conductive path forms more than one inductive path having more than two terminals and corresponding inductances. In the embodiment, at least one portion of a first electronic device is disposed in a first space, at least partially surrounded by the at least one conductive path.

In another embodiment, a package structure is provided. The package structure comprises a magnetic body having a top surface and a bottom surface, wherein a plurality of conductive through holes are formed from the top surface to the bottom surface of the magnetic body, and the plurality of conductive through holes are electrically connected via first conductive patterns disposed over the top surface of the magnetic body and second conductive patterns disposed over the bottom surface of the magnetic body so as to form at least one conductive path, each passing through the plurality of conductive through holes, wherein each of the at least one conductive path has two terminals and a corresponding inductance. In the embodiment, the first conductive patterns comprise a plurality of first traces and the second conductive patterns comprise a plurality of second traces to electrically connect each two corresponding conductive through holes on the top and bottom surfaces, respectively, of the magnetic body. At least one portion of a first electronic device is disposed in a first space, at least partially surrounded by the at least one conductive path. Additionally, third conductive patterns are disposed over the magnetic body and the at least one electronic device for electrically connecting with the at least one conductive path of the magnetic body and the at least one portion of a first electronic device. In the embodiment, the at least one conductive path forms a coil having a first terminal and a second terminal. In another embodiment, the at least one conductive path forms more than one inductive path having more than two terminals and corresponding inductances. In the embodiment, at least one portion of a second electronic device is disposed on the third conductive patterns, which is electrically connected to the at least one conductive path of the magnetic body and the at least one portion of a first electronic device.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

Figure 1:
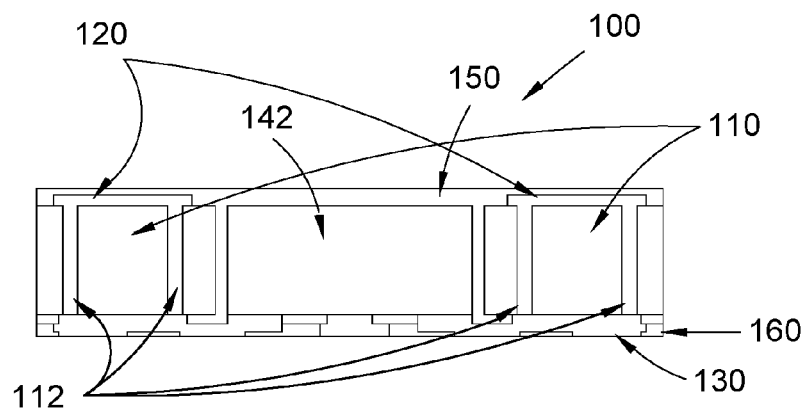
FIG. 1 is a partially schematic, side view of an inductive component in accordance with an embodiment of the invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
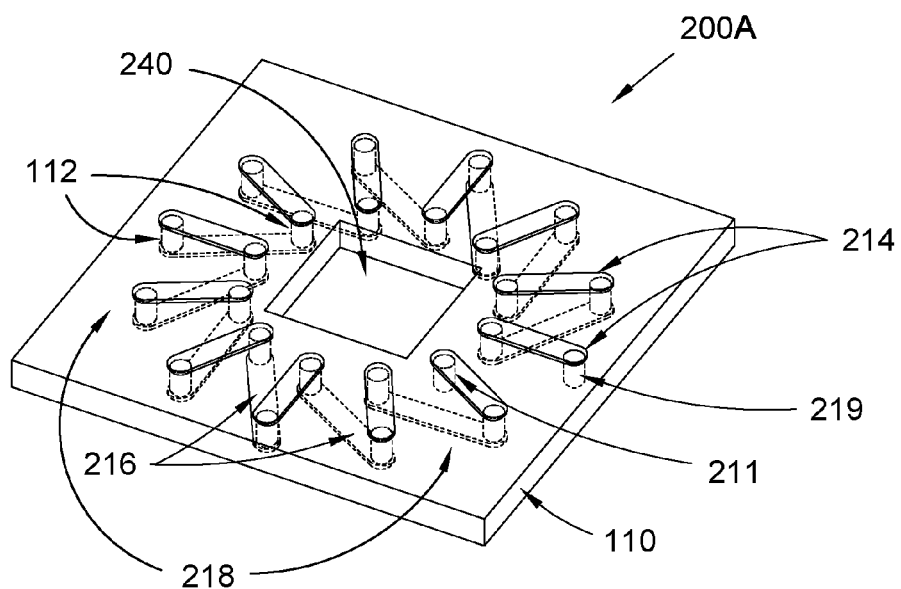
FIG. 2A is a schematic, 3D view of at least one conductive path formation of an inductive component in accordance with an embodiment of the invention.
Figure 2B:
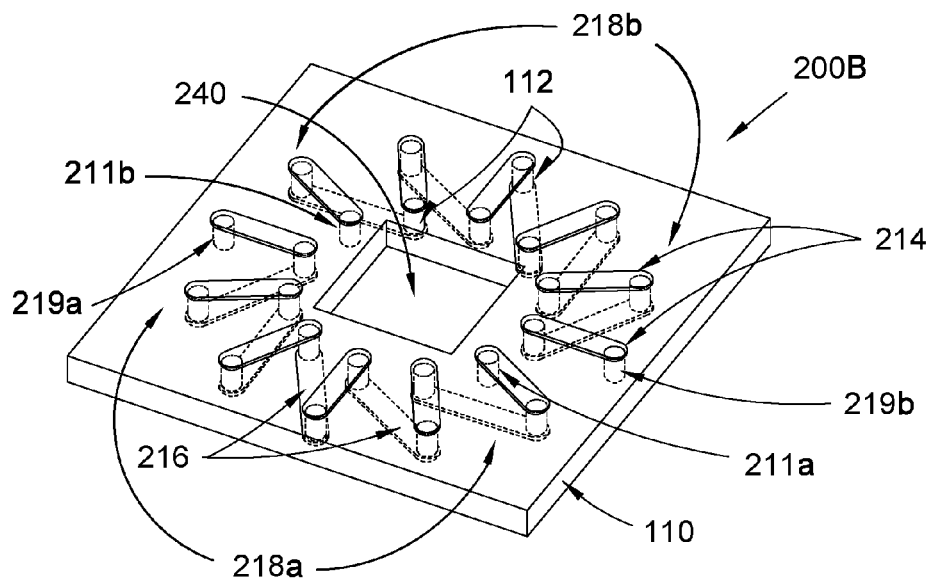
FIG. 2B is a schematic, 3D view of two conductive path formations of two inductances, respectively, in accordance with an embodiment of the invention.

FIG. 1 is a partially schematic, side view of an inductive component in accordance with an embodiment of the invention. As shown in FIG. 1, the inductive component 100 comprises a magnetic body 110 having a top surface and a bottom surface. In the embodiment, there is a plurality of conductive through holes 112 formed from the top surface to the bottom surface of the magnetic body, wherein the plurality of conductive through holes 112 are electrically connected via first conductive patterns 120 disposed over the top surface of the magnetic body 110 and second conductive patterns 130 disposed over the bottom surface of the magnetic body 110 so as to form at least one conductive path, each passing through a corresponding set of conductive through holes, wherein each of the at least one conductive path has two terminals and a corresponding inductance. Reference may be made to FIG. 2A, showing the at least one conductive path having two terminals and a corresponding inductance and FIG. 2B, showing more than one conductive path having four terminals and corresponding inductances.

In an embodiment, the at least one conductive path forms a coil having a first terminal and a second terminal. In the embodiment, at least one portion of a first electronic device is disposed in a first space, at least partially surrounded by the at least one conductive path. In the embodiment, the first electronic device comprises a semiconductor die 142. In the embodiment, a plurality of electronic devices such as semiconductor dies or integrated circuits can be placed in the first space, at least partially surrounded by the at least one conductive path (refer to FIG. 2A). In another embodiment, the space, at least partially surrounded by the at least one conductive path, is entirely a through hole opening for accommodating the electronic devices such as semiconductor dies or integrated circuits. In yet another embodiment, the magnetic body has a recess that is at least partially surrounded by the at least one conductive path, wherein the first electronic device is disposed in the recess. Still referring to FIG. 1, the first conductive patterns 120 are disposed on the top surface of the magnetic body 110, a first insulating layer 150 is disposed on the first conductive patterns 120 and the second conductive patterns 130 are disposed on the bottom surface of the magnetic body 110. However, the invention is not limited thereto. In another embodiment, the first conductive patterns 120 may be disposed on a first insulating layer disposed on the top surface of the magnetic body 110 and the second conductive patterns 130 may be disposed on a second insulating layer disposed on the bottom surface of the magnetic body 110. Additionally, the second conductive patterns 130 can be integrated with a substrate 160, allowing for electrical connections between the devices of the inductive component 100, such as the at least one conductive path of the magnetic body 110 and the semiconductor die 142 disposed in the space, at least partially surrounded by the at least one conductive path, and external circuits (not shown).

FIG. 2A is a schematic, 3D view of at least one conductive path formation of an inductive component in accordance with an embodiment of the invention. As shown in FIG. 2A with reference to FIG. 1, the inductive component 200 comprises a magnetic body 110 having a top surface and a bottom surface. A plurality of conductive through holes 112 are formed from the top surface to the bottom surface of the magnetic body 110 for forming at least one conductive path 218 having a first terminal 211 and a second terminal 219. In one embodiment, the at least one conductive path 218 is electrically connected to the semiconductor die 142 (please refer to FIG. 1) disposed in the space 240 for accommodating the electronic devices through the first terminal 211 or the second terminal 219 of the at least one conductive path 218. In one embodiment, the space 240 for accommodating the electronic devices is entirely a through hole opening. In yet another embodiment, the space 240 is a recess formed on the magnetic body 110, wherein the first electronic device can be disposed in the recess. The plurality of conductive through holes 112 are respectfully disposed in pairs, with one of the pair correspondingly disposed toward the outer edge of the magnetic body 110 and the other of the pair correspondingly disposed toward the center of the magnetic body 110. In one embodiment, first conductive patterns are disposed on the top surface of the magnetic body 110 and second conductive patterns are disposed on the bottom surface of the magnetic body 110. In another embodiment, the first conductive patterns comprise a plurality of first traces 214 to electrically connect each two corresponding conductive through holes 112 on the top surface of the magnetic body 110, wherein a plurality of first conductive regions are formed between the plurality of first traces 214.

In one embodiment, the second conductive patterns comprise a plurality of second traces 216 to electrically connect each two corresponding conductive through holes 112 on the bottom surface of the magnetic body 110, wherein a plurality of second conductive regions are formed between the plurality of second traces 216 on the bottom surface of the magnetic body 110. However, the invention is not limited thereto. In a further embodiment, the first conductive patterns may comprise a plurality of first bonding wires and the second conductive patterns may comprise a plurality of second bonding wires. Still, referring to FIG. 2A, in the embodiment, the plurality of first traces 214 are formed relatively perpendicular to the center of the magnetic body 110 and the plurality of second traces 216 are formed relatively diagonally to the center of the magnetic body 110. However, the invention is not limited thereto. The plurality of first traces 214 and the plurality of second traces 216 may be formed with any angle toward the center of the magnetic body 110, wherein a space 240 is provided, at least partially surrounded by the at least one conductive path 218.

FIG. 2B is a schematic, 3D view of two conductive path formations of two inductances, respectively, in accordance with an embodiment of the invention. The difference in the embodiment of FIG. 2A and the embodiment of FIG. 2B, is that in the embodiment of FIG. 2B, the plurality of conductive through holes 112, formed from the top surface to the bottom surface of the magnetic body 110, form more than one conductive path and have more than two terminals and corresponding inductances, as the invention is not limited to forming only one conductive path having two terminals and corresponding inductances. As shown in FIG. 2B, a plurality of conductive through holes 112 are formed from the top surface to the bottom surface of the magnetic body 110 for forming a first conductive path 218a having a first terminal 211a and a second terminal 219a and a second conductive path 218b having a third terminal 211b and fourth terminal 219b, respectively. In other embodiments, the first conductive path 218a and second conductive path 218b may be electrically connected to more than one semiconductor die disposed in the space 240 for accommodating the electronic devices through the first terminal 211a and second terminal 219a and third terminal 211b and fourth terminal 219b, respectively.

In the embodiments of the invention, the induced current effects of the magnetic field of the inductive components having low profile requirements, occurs mainly at the outer edges of the magnetic body and is minimalized at the center. This allows for the at least one portion of a first electronic device to be disposed in the space, at least partially surrounded by the at least one conductive path of the magnetic body, wherein other parts or circuitry of the at least one portion of a first electronic device is minimally affected. Accordingly, when inductive components are required in a system along with the at least one portion of a first electronic device, they do not have to be electrically connected externally. Thus, the total layout area for systems designed having the at least one portion of a first electronic device and inductive component may be decreased. Also, the advantageous of modulation may be achieved as the at least one portion of a first electronic device and inductive component may manufactured, packaged and tested, as a complete module.

Figure 3A:
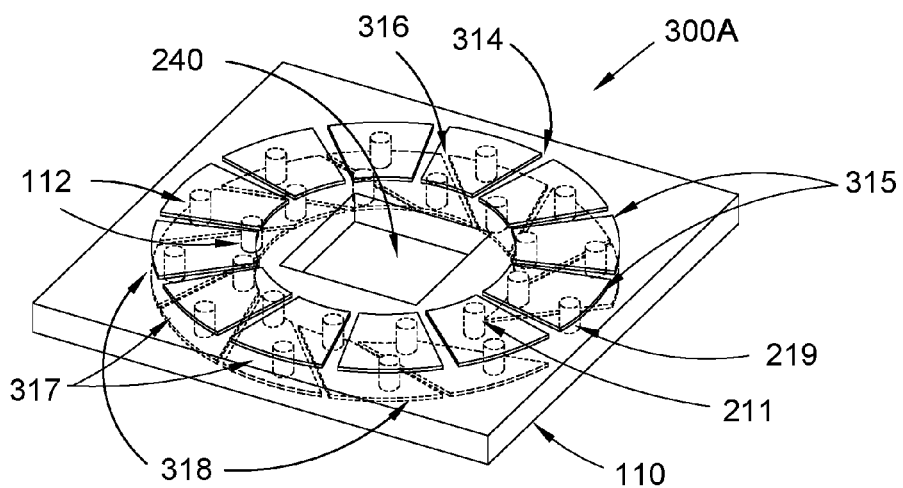
FIG. 3A is a partially schematic, 3D view of another conductive path formation of an inductive component in accordance with an embodiment of the invention.

FIG. 3A is a partially schematic, 3D view of another conductive path formation of an inductive component in accordance with an embodiment of the invention. As shown in FIG. 3A, with reference to FIG. 2A, the inductive component 300 comprises a magnetic body 110, and a plurality of conductive through holes 112 formed from the top surface to the bottom surface of the magnetic body 110, having a first terminal 211 and a second terminal 219. Similarly, first conductive patterns are disposed on the top surface of the magnetic body 110 and second conductive patterns are disposed on the bottom surface of the magnetic body 110. The difference between the embodiment of FIG. 2A and the embodiment of FIG. 3A, is that in the embodiment of FIG. 3A, the first conductive patterns comprise a plurality of first shielding traces 315 on the top surface of the magnetic body 110, wherein each two adjacent first shielding traces 315 are separated by a first slim gap 314. Also, the second conductive patterns comprise a plurality of second shielding traces 317 on the bottom surface of the magnetic body 110, wherein each two adjacent second shielding traces 317 are separated by a second slim gap 316. With the addition of the plurality of first shielding traces 315 and the plurality of second shielding traces 317, the induced current effects of a magnetic field of an inductive component having low profile requirements, may be even further contained at the outer edges of the magnetic body 110 and further minimized at the center of the magnetic body 110.

Figure 3B:
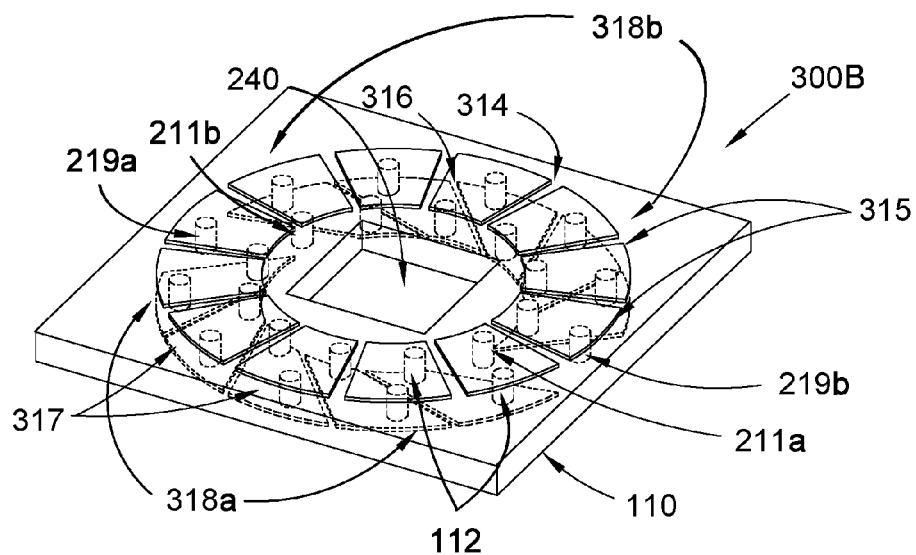
FIG. 3B is a partially schematic, 3D view of another two conductive path formation of two inductances, respectively, in accordance with an embodiment of the invention.

FIG. 3B is a partially schematic, 3D view of another two conductive path formation of two inductances, respectively, in accordance with an embodiment of the invention. The difference in the embodiment of FIG. 3A and the embodiment of FIG. 3B, is that in the embodiment of FIG. 3B, the plurality of conductive through holes 112, formed from the top surface to the bottom surface of the magnetic body 110, form more than one conductive path and have more than two terminals and corresponding inductances, as the invention is not limited to forming only one conductive path having two terminals and corresponding inductances. As shown in FIG. 3B, a plurality of conductive through holes 112 are formed from the top surface to the bottom surface of the magnetic body 110 for forming a first conductive path 318a having a first terminal 211a and a second terminal 219a and a second conductive path 318b having a third terminal 211b and fourth terminal 219b, respectively. In other embodiments, the first conductive path 318a and second conductive path 318b may be electrically connected to more than one semiconductor die disposed in the space 240 for accommodating the electronic devices through the first terminal 211a and second terminal 219a and third terminal 211b and fourth terminal 219b, respectively. Please note that each conductive through hole in FIG. 2A, FIG. 2B, FIG. 3A and FIG. 3B, can be a conductive pillar or having conductive material disposed in side wall of the trough hole to from a conductive path, that is as long as a conductive path is formed in the through hole, it will be called a conductive through hole.

Figure 4:
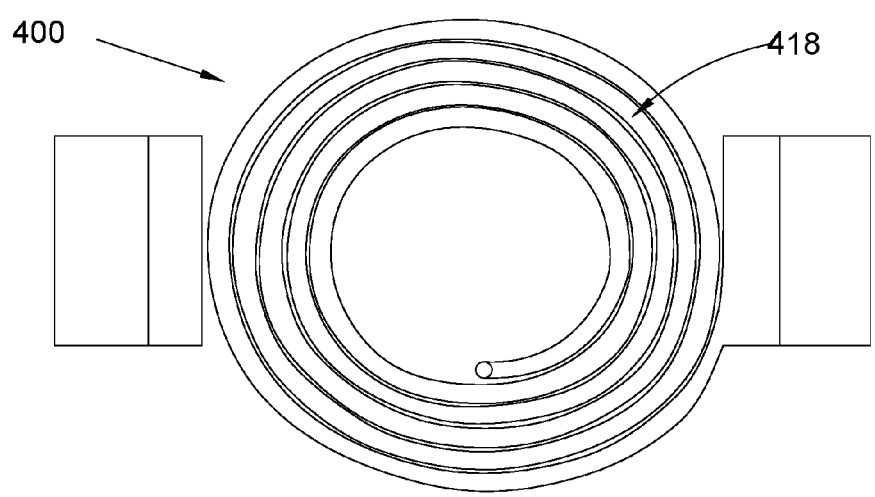
FIG. 4 is a partially schematic, top view of yet another conductive path formation of an inductive component in accordance with an embodiment of the invention.

In the embodiments of the invention, a top-down horizontal winding method is described in reference to FIG. 2A, FIG. 2B, FIG. 3A and FIG. 3B and applied to the embodiments herein. However, the invention is not limited thereto. Other types of winding methods may also be utilized. FIG. 4 is a partially schematic, top view of yet another conductive path formation of an inductive component in accordance with an embodiment of the invention. As shown in FIG. 4, in the embodiment, a flat vertical winding method may also be utilized, wherein a space is still provided, at least partially surrounded by a circular conductive path formation 418, for at least one portion of a first electronic device to be disposed therein.

Figure 5:
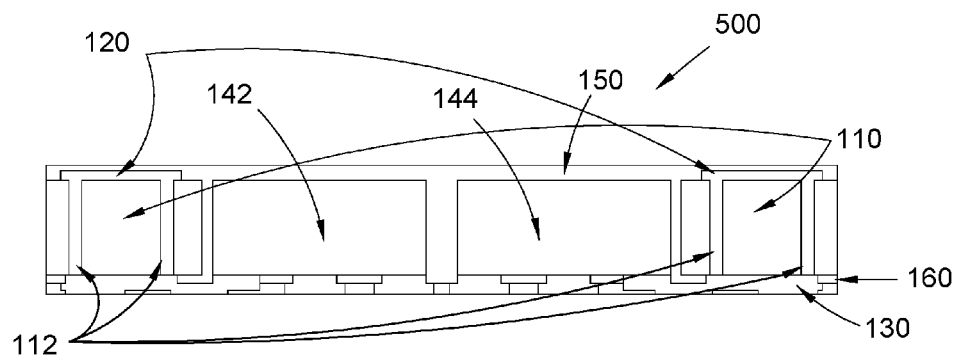
FIG. 5 is a partially schematic, side view of another inductive component in accordance with an embodiment of the invention.
Figure 6:
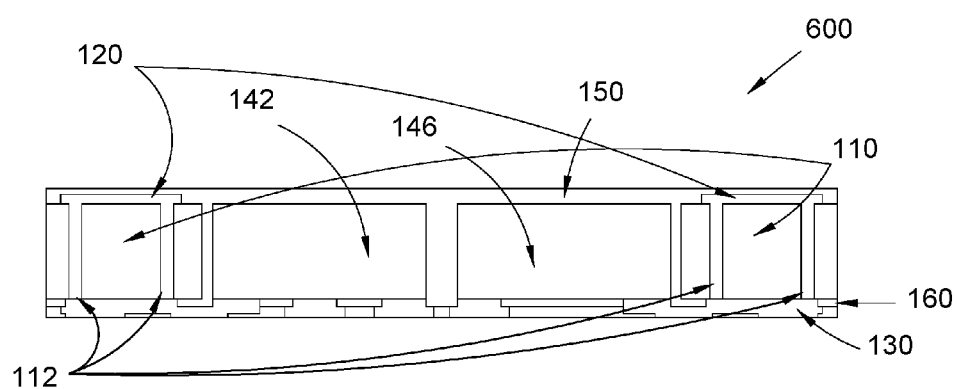
FIG. 6 is a partially schematic, side view of yet another inductive component in accordance with an embodiment of the invention.

FIG. 5 is a partially schematic, side view of an inductive component in accordance with another embodiment of the invention and FIG. 6 is a partially schematic, side view of an inductive component in accordance with yet another embodiment of the invention. As shown in FIG. 5 and FIG. 6, with reference to FIG. 2A, the inductive components 500, 600, respectfully, comprise a magnetic body 110, a plurality of conductive through holes 112, first conductive patterns 120 disposed over the top surface of the magnetic body 110 and second conductive patterns 130 disposed over the bottom surface of the magnetic body 110, forming at least one conductive path 218. The difference between the embodiment of FIG. 1 and the embodiments of FIG. 5 and FIG. 6, respectively, is that the at least one portion of a first electronic device disposed in the space 240, at least partially surrounded by the at least one conductive path 218, comprises more than one semiconductor die 142. Referring to FIG. 5, in addition to the one semiconductor die 142 being disposed in the space 240, at least partially surrounded by the at least one conductive path 218, the at least one portion of a first electronic device also comprises a second semiconductor die 144. Meanwhile, referring to FIG. 6, in addition to the one semiconductor die 142 being disposed in the space 240, at least partially surrounded by the at least one conductive path 218, the at least one portion of a first electronic device also comprises a passive electronic component 146. The semiconductor die 142 may comprise an integrated circuit and the passive electronic component 146 may comprise a resistor or a capacitor. However, the invention is not limited thereto. Other types of semiconductor die and passive electronic components in any amount or combinations thereof may be disposed in the space 240, at least partially surrounded by the at least one conductive path 218. Still referring to FIG. 5 and FIG. 6, respectfully, and similar to FIG. 1, in the embodiments of FIG. 5 and FIG. 6, the first conductive patterns 120 are disposed on the top surface of the magnetic body 110 and a first insulating layer 150 is disposed on the first conductive patterns 120. Meanwhile, the second conductive patterns 130 are disposed on the bottom surface of the magnetic body 110. Also, in other embodiments of FIG. 5 and FIG. 6, respectively, the first conductive patterns 120 may be disposed on the first insulating layer disposed on the top surface of the magnetic body and the second conductive patterns 130 may be disposed on a second insulating layer disposed on the bottom surface of the magnetic body. Still referring to FIG. 5 and FIG. 6, respectfully, the second conductive patterns 130 can be integrated with a substrate 160, allowing for electrical connections between the devices of the inductive components 500, 600, respectively, such as the at least one conductive path 218 of the magnetic body 110 and the semiconductor die 142, 144 of FIG. 5 and semiconductor die 142 and passive electronic component 146 of FIG. 6, and external circuits (not shown).

Figure 7:
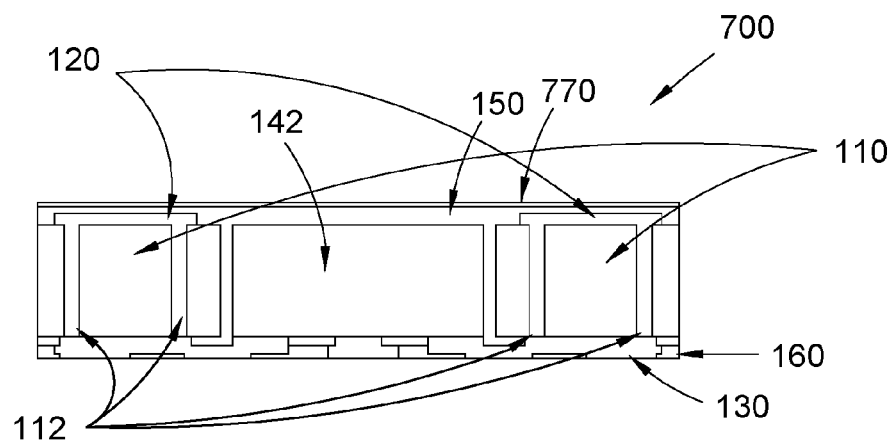
FIG. 7 is a partially schematic, side view of an inductive component having a shielding layer formed thereon in accordance with an embodiment of the invention.
Figure 8:
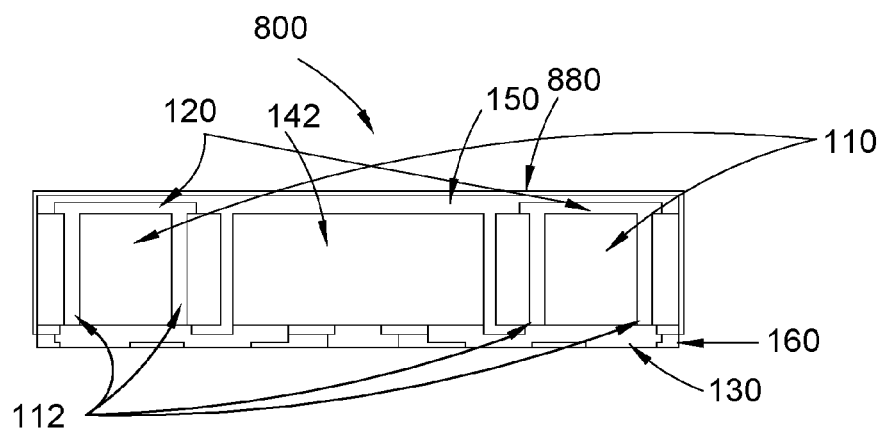
FIG. 8 is a partially schematic, side view of another inductive component having a shielding layer formed thereon in accordance with an embodiment of the invention.

FIG. 7 is a partially schematic, side view of an inductive component having a shielding layer formed thereon in accordance with an embodiment of the invention and FIG. 8 is a partially schematic, side view of another inductive component having a shielding layer formed thereon in accordance with an embodiment of the invention. As shown in FIG. 7 and FIG. 8, with reference to FIG. 2A, the inductive components 700, 800, respectfully, comprise a magnetic body 110, a plurality of conductive through holes 112, first conductive patterns 120 disposed over the top surface of the magnetic body 110 and second conductive patterns 130 disposed over the bottom surface of the magnetic body 110, forming at least one conductive path 218. In the embodiments, at least one portion of a first electronic device is disposed in a first space, at least partially surrounded by the at least one conductive path 218, wherein the at least one portion of a first electronic device comprises a semiconductor die 142. Also, the first conductive patterns 120 are disposed on the top surface of the magnetic body 110 and a first insulating layer 150 is disposed on the first conductive patterns 120. Meanwhile, the second conductive patterns 130 are disposed on the bottom surface of the magnetic body 110, wherein the second conductive patterns 130 can be integrated with a substrate 160, allowing for electrical connections between the devices of the components 700, 800, respectfully, such as the at least one conductive path 218 of the magnetic body 110 and the semiconductor die 142 disposed in the space 240, at least partially surrounded by the at least one conductive path 218, and external circuits (not shown). Still referring to FIG. 7 and FIG. 8, the difference between the embodiment of FIG. 1 and the embodiments of FIG. 7 and FIG. 8, respectively, is that a top shielding layer 770 is formed over the top surface of the magnetic body 110, the first conductive patterns 120, the semiconductor die 142 disposed in the space 240, at least partially surrounded by the at least one conductive path 218, and the first insulating layer 150 of the inductive component 700. In the embodiment, the top shielding layer 770 is formed over the top of the inductive component 700. However, the invention is not limited thereto. Referring to FIG. 8, a U-shaped shielding layer 880 is formed over the top and outer side surfaces of the magnetic body 110, the semiconductor die 142 disposed in the space 240, at least partially surrounded by the at least one conductive path 218, the first conductive patterns 120, and the first insulating layer 150 of the inductive component 800. With the addition of the top shielding layer 770 of FIG. 7, and the U-shaped shielding layer 880 of FIG. 8, respectively, a means for electromagnetic interference (EMI) shielding and protection is obtained. Additionally, with the circuitry of the inductive components 700, 800, partially and completely isolated and not subject to external EMI, respectfully, inductive components 700, 800, in turn, do not interfere with other external electronic devices.

Figure 9:
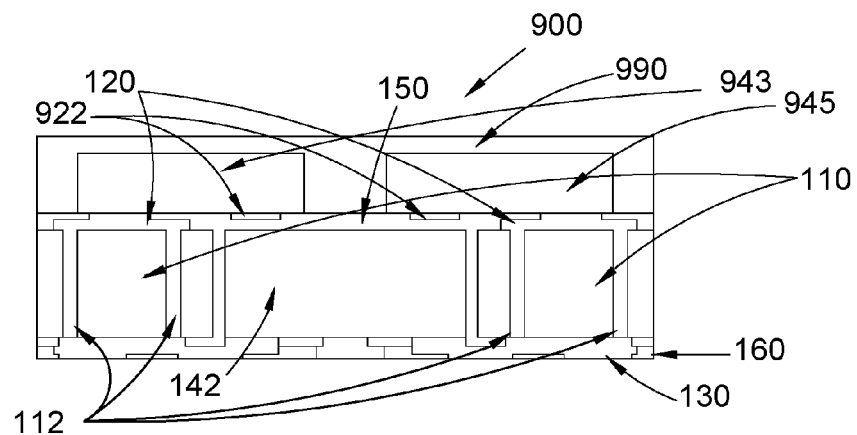
FIG. 9 is a partially schematic, side view of a package structure in accordance with an embodiment of the invention.

FIG. 9 is a partially schematic, side view of a package structure in accordance with an embodiment of the invention. As shown in FIG. 9, with reference to FIG. 2A, the package structure 900 comprises a magnetic body 110 having a top surface and a bottom surface. In the embodiment, there is a plurality of conductive through holes 112 formed from the top surface to the bottom surface of the magnetic body, wherein the plurality of conductive through holes 112 are electrically connected via first conductive patterns 120 disposed over the top surface of the magnetic body 110 and second conductive patterns 130 disposed over the bottom surface of the magnetic body 110 so as to form at least one conductive path 218, each passing through the plurality of conductive through holes 112, forming a coil having a first terminal 211 and a second terminal 219, however, the invention is not limited thereto. More than one conductive path having more than two terminals and corresponding inductances may be formed. In the embodiment, at least one portion of a first electronic device is disposed in a first space surrounded by the at least one conductive path 218. In the embodiment, the at least one portion of a first electronic device comprises a semiconductor die 142. Also, the first conductive patterns 120 are disposed on the top surface of the magnetic body 110 and third conductive patterns 922 are disposed over the magnetic body 110 and the semiconductor die 142 for electrically connecting with the at least one conductive path 218 of the magnetic body 110 and the semiconductor die 142, and external circuits (not shown). However, the invention is not limited thereto. In another embodiment the third conductive patterns 922 may be disposed on a first insulating layer that is disposed on the top surface of the magnetic body 110 and the first conductive patterns 120. Still referring to FIG. 9, in the embodiment, at least one portion of a second electronic device is disposed on the third conductive patterns 922, wherein the at least one portion of a second electronic device comprises two semiconductor die 943, 945, respectfully, encased in a body 990, electrically connected to the at least one conductive path 218 of the magnetic body 110 and the semiconductor die 142. Meanwhile, the second conductive patterns 130 are disposed on the bottom surface of the magnetic body 110. However, the invention is not limited thereto. In another embodiment, the first conductive patterns 120 may be disposed on a first insulating layer disposed on the top surface of the magnetic body 110 and the second conductive patterns 130 may be disposed on a second insulating layer disposed on the bottom surface of the magnetic body 110. Still referring to FIG. 9, the second conductive patterns 130 are integrated with a substrate 160, allowing for electrical connections between the devices of the package structure 900, such as the two semiconductor die 943, 945 disposed on the third conductive patterns 922, at least one conductive path 218 of the magnetic body 110 and the semiconductor die 142 disposed in the space 240, at least partially surrounded by the at least one conductive path 218, and external circuits (not shown).

Figure 10:
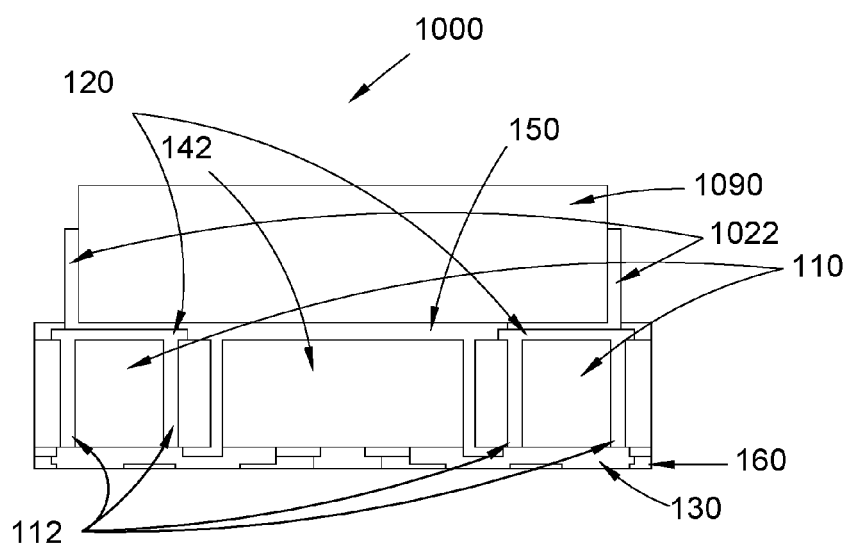
FIG. 10 is a partially schematic, side view of another package structure in accordance with an embodiment of the invention.

FIG. 10 is a partially schematic, side view of another package structure in accordance with an embodiment of the invention. As shown in FIG. 10, with reference to FIG. 2A, the package structure 1000 comprises a magnetic body 110, first conductive patterns 120 disposed over the top surface of the magnetic body 110 and second conductive patterns 130 disposed over the bottom surface of the magnetic body 110 so as to form at least one conductive path 218, each passing through a plurality of conductive through holes 112, forming a coil having a first terminal 211 and a second terminal 219, however, the invention is not limited thereto. More than one conductive path having more than two terminals and corresponding inductances may be formed. At least one portion of a first electronic device is disposed in a first space, at least partially surrounded by the at least one conductive path 218. In the embodiment, the at least one portion of a first electronic device comprises a semiconductor die 142. Additionally, at least one portion of a second electronic device is disposed over the magnetic body 110 and semiconductor die 142. The difference between the embodiment of FIG. 9 and the embodiment of FIG. 10, is that no third conductive patterns 922 are disposed over the magnetic body 110 and the semiconductor die 142 for electrically connecting with the at least one conductive path 218 of the magnetic body 110 and the semiconductor die 142, and external circuits (not shown). Instead, leads 1022 are used for electrically connecting the at least one portion of a second electronic device with the at least one conductive path 218 of the magnetic body 110 and the semiconductor die 142, and external circuits (not shown). Additionally, the at least one portion of a second electronic device comprises active and passive components encased in a body 1090, and is electrically connected to the at least one conductive path 218 of the magnetic body 110 and the semiconductor die 142. Meanwhile, the second conductive patterns 130 are disposed on the bottom surface of the magnetic body 110. Additionally, the second conductive patterns 130 can be integrated with a substrate 160, allowing for electrical connections between the devices of the package structure 1000, such as the active and passive components encased in the body 1090, at least one conductive path 218 of the magnetic body 110 and the semiconductor die 142 disposed in the space 240, at least partially surrounded by the at least one conductive path 218, and external circuits (not shown).

Figure 11:
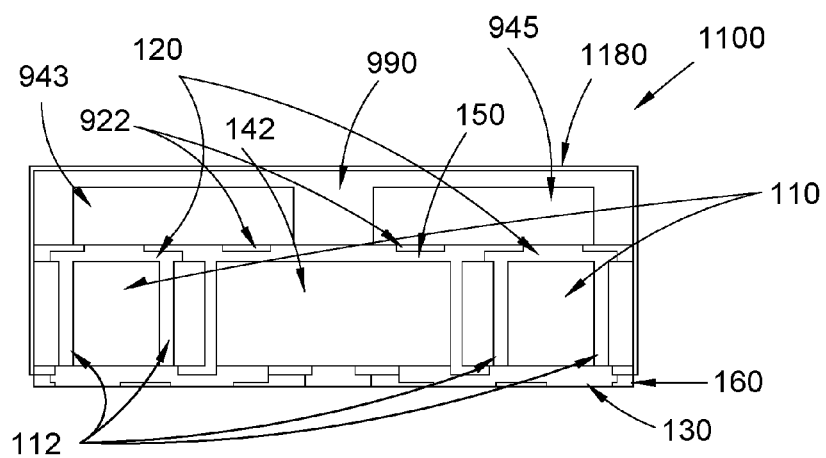
FIG. 11 is a partially schematic, side view of a package structure having a shielding layer formed thereon in accordance with an embodiment of the invention.

FIG. 11 is a partially schematic, side view of a package structure having a shielding layer formed thereon in accordance with an embodiment of the invention. As shown in FIG. 11, with reference to FIG. 2A, the package structure 1100 comprises a magnetic body 110 having a top surface and a bottom surface, first conductive patterns 120 disposed over the top surface of the magnetic body 110 and second conductive patterns 130 disposed over the bottom surface of the magnetic body 110 so as to form at least one conductive path 218, each passing through a plurality of conductive through holes 112, forming a coil having a first terminal 211 and a second terminal 219, however, the invention is not limited thereto. More than one conductive path having more than two terminals and corresponding inductances may be formed. At least one portion of a first electronic device is disposed in a first space surrounded by the at least one conductive path 218. In the embodiment, the at least one portion of a first electronic device comprises a semiconductor die 142. Also, the first conductive patterns 120 are disposed on the top surface of the magnetic body 110 and third conductive patterns 922 are disposed over the magnetic body 110 and the semiconductor die 142 for electrically connecting with the at least one conductive path 218 of the magnetic body 110 and the semiconductor die 142, and external circuits (not shown). In the embodiment, at least one portion of a second electronic device is disposed on the third conductive patterns 922, wherein the at least one portion of a second electronic device comprises two semiconductor die 943, 945, respectfully, encased in a body 990, electrically connected to the at least one conductive path 218 of the magnetic body 110 and the semiconductor die 142, and external circuits (not shown). The difference between the embodiment of FIG. 11 and the embodiment of FIG. 9, is that a U-shaped shielding layer 1180 is formed over the top and outer side surfaces of the body 990 and the magnetic body 110, respectively. With the addition of the U-shaped shielding layer 1180, a means for electromagnetic interference (EMI) shielding and protection is obtained. Additionally, with the circuitry of the components in the package structure 1100 completely isolated and not subject to external EMI, the components in the package structure 1100, in turn, do not interfere with other external electronic devices. Still referring to FIG. 11, the second conductive patterns 130 are disposed on the bottom surface of the magnetic body 110. Additionally, the second conductive patterns 130 can be integrated with a substrate 160, allowing for electrical connections between the devices of the package structure 1100, such as the two semiconductor die 943, 945 disposed on the third conductive patterns 922, at least one conductive path 218 of the magnetic body 110 and the semiconductor die 142 disposed in the space 240, at least partially surrounded by the at least one conductive path 218, and external circuits (not shown).

Figure 12A:
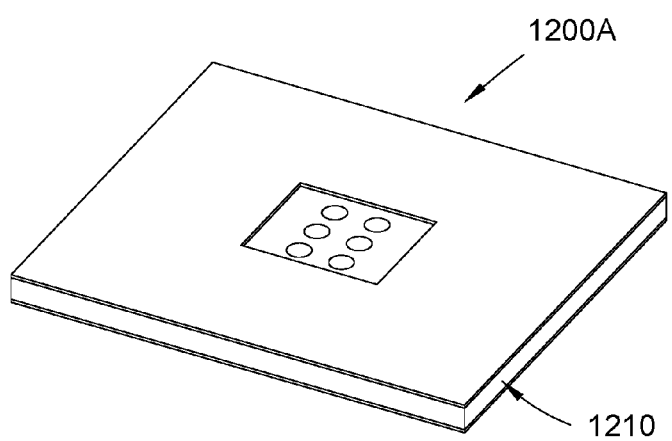
FIGS. 12A to 12D are schematic, top views illustrating an example of steps for manufacturing an inductive component in accordance with an embodiment of the invention.
Figure 12B:
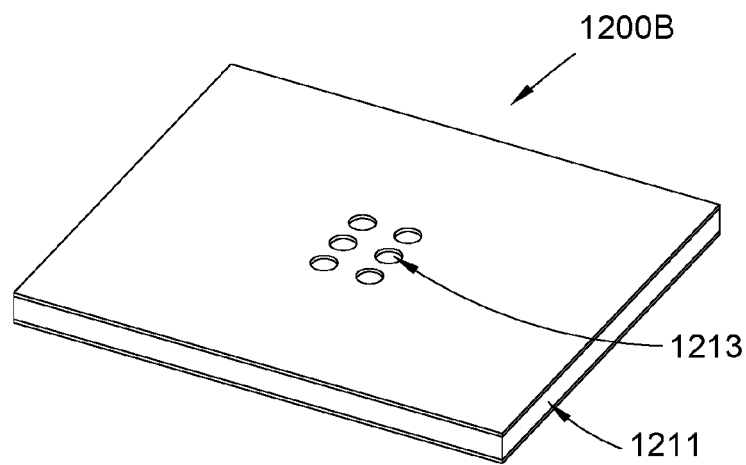
Figure 12C:
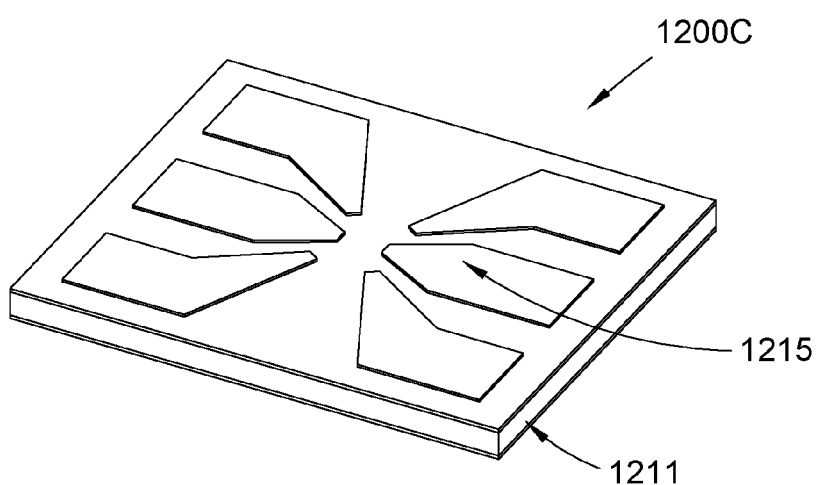
Figure 12D:
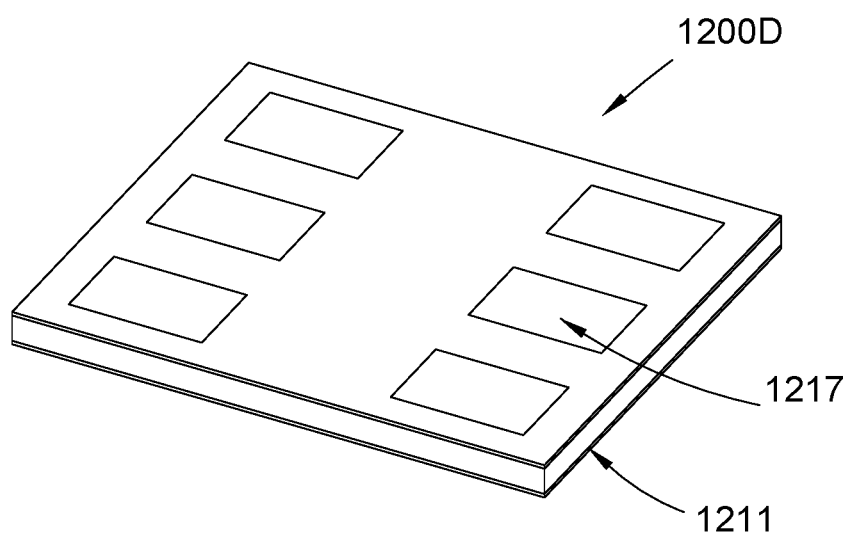

FIGS. 12A to 12D are schematic, top views illustrating an example of steps for manufacturing an inductive component in accordance with an embodiment of the invention. First, as shown in FIG. 12A, with reference to FIG. 2A, at least one portion of a first electronic device is disposed in a first space surrounded by the at least one conductive path 218 of the magnetic body 1210 through die bonding. The method, for example, eutectic, solder, adhesive etc., used for die bonding may be dependent upon operating conditions and environmental and reliability requirements. After, as shown in FIG. 12B, sheets are laminated 1211 and a plurality of connecting pad holes 1213 are opened. The sheets may be prepared from a slurry of particulates, binders, plasticizers, and solvents. After laminating, the sheets are fired or sintered at temperatures sufficient to burn-off or remove unwanted binder resin and sinter the particulates together for a dense substrate. Next, as shown in FIG. 12C, plating is performed and a plurality of redistribution layer (RDL) circuits 1215 are electrically connected. Lastly, as shown in FIG. 12D, a solder mask layer is formed and a plurality of electrically connectable pads 1217 are opened.

Still referring to FIGS. 12A to 12D, in a further embodiment, should a means for electromagnetic interference (EMI) shielding and protection be required of the package structure, a top shielding layer or a U-shaped shielding layer may be formed over the top and outer side surfaces of the package structure, respectively, before dicing, slicing or singulation.

In the embodiments of the invention, the induced current effects of the magnetic field of the inductive components having low profile requirements, occurs mainly at the outer edges of the magnetic body and is minimalized at the center. This allows for at least one portion of a first electronic device to be disposed in the space, at least partially surrounded by the at least one conductive path of the magnetic body, wherein other parts or circuitry of the at least one portion of a first electronic device is minimally affected. Accordingly, when inductive components are required in a system along with the at least one portion of a first electronic device, they do not have to be electrically connected externally. Thus, the total layout area for systems designed having the at least one portion of a first electronic device and inductive component may be decreased. Also, the advantageous of modulation may be achieved as the at least one portion of a first electronic device and inductive component may manufactured, packaged and tested, as a complete module.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An inductive component, comprising:
 a unitary magnetic body having a top surface and a bottom surface, wherein a plurality of conductive through holes are formed in the unitary magnetic body, wherein each conductive through hole extends from the top surface to the bottom surface of the unitary magnetic body, and the plurality of conductive through holes are electrically connected via first conductive patterns disposed over the top surface of the unitary magnetic body and second conductive patterns disposed over the bottom surface of the unitary magnetic body so as to form at least one conductive path, each passing through a corresponding set of conductive through holes, wherein each of the at least one conductive path has two terminals and a corresponding inductance, and wherein at least one portion of a first electronic device is disposed in a first space, at least partially surrounded by the at least one conductive path.

2. The inductive component as claimed in claim 1, wherein the at least one conductive path forms a coil having a first terminal and a second terminal.

3. The inductive component as claimed in claim 1, wherein the at least one conductive path forms a first conductive path having a first terminal and a second terminal and a second conductive path having a third terminal and a fourth terminal.

4. The inductive component as claimed in claim 1, wherein the first conductive patterns and the second conductive patterns comprise bonding wires.

5. The inductive component as claimed in claim 1, wherein the first conductive patterns and the second conductive patterns are formed by a film process.

6. The inductive component as claimed in claim 1, wherein the first conductive patterns comprise a plurality of first shielding traces to electrically connect each two corresponding conductive through holes on the top surface of the unitary magnetic body, and wherein each two adjacent first shielding traces are separated by a first slim gap.

7. The inductive component as claimed in claim 6, wherein the second conductive patterns comprise a plurality of second shielding traces to electrically connect each two corresponding conductive through holes on the bottom surface of the unitary magnetic body, and wherein each two adjacent second shielding traces are separated by a second slim gap.

8. The inductive component as claimed in claim 1, wherein the first conductive patterns are disposed on the top surface of the unitary magnetic body and the second conductive patterns are disposed on the bottom surface of the unitary magnetic body.

9. The inductive component as claimed in claim 1, wherein the first conductive patterns are disposed on a first insulating layer disposed on the top surface of the unitary magnetic body and the second conductive patterns are disposed on a second insulating layer disposed on the bottom surface of the unitary magnetic body.

10. The inductive component as claimed in claim 2, wherein the first electronic device comprises a semiconductor die, and wherein the coil is electrically connected to the semiconductor die.

11. The inductive component as claimed in claim 2, wherein at least one portion of a second electronic device is disposed in a second space, at least partially surrounded by the coil.

12. The inductive component as claimed in claim 1, wherein a U-shaped shielding layer is disposed over the top and outer side surfaces of the unitary magnetic body.

13. A package structure, comprising:
a unitary magnetic body having a top surface and a bottom surface, wherein a plurality of conductive through holes are formed in the unitary magnetic body, wherein each conductive through hole extends from the top surface to the bottom surface of the unitary magnetic body, and the plurality of conductive through holes are electrically connected via first conductive patterns disposed over the top surface of the unitary magnetic body and second conductive patterns disposed over the bottom surface of the unitary magnetic body so as to form at least one conductive path, each passing through a corresponding set of conductive through holes, wherein each of the at least one conductive path has two terminals and a corresponding inductance; and
a first electronic device, wherein at least one portion of the first electronic device is disposed in a first space, at least partially surrounded by the at least one conductive path.

14. The package structure as claimed in claim 13, wherein the at least one conductive path forms a coil having a first terminal and a second terminal.

15. The package structure as claimed in claim 13, wherein the at least one conductive path forms a first conductive path having a first terminal and a second terminal and a second conductive path having a third terminal and a fourth terminal.

16. The package structure as claimed in claim 13, wherein the first conductive patterns comprise a plurality of first shielding traces to electrically connect each two corresponding conductive through holes on the top surface of the unitary magnetic body, and wherein each two adjacent first shielding traces are separated by a first slim gap.

17. The package structure as claimed in claim 13, wherein the second conductive patterns comprise a plurality of second shielding traces to electrically connect each two corresponding conductive through holes on the bottom surface of the unitary magnetic body, and wherein each two adjacent second shielding traces are separated by a second slim gap.

18. The package structure as claimed in claim 13, wherein the first conductive patterns are disposed on a first insulating layer disposed on the top surface of the unitary magnetic body and the second conductive patterns are disposed on a second insulating layer disposed on the bottom surface of the unitary magnetic body.

19. The package structure as claimed in claim 14, further comprising third conductive patterns disposed over the unitary magnetic body and the first electronic device for electrically connecting with the coil and the first electronic device.

20. The package structure as claimed in claim 19, further comprising a second electronic device disposed over the third conductive patterns, wherein the second electronic device is electrically connected to the first electronic device via the third conductive patterns.

* * * * *